Figure 1:
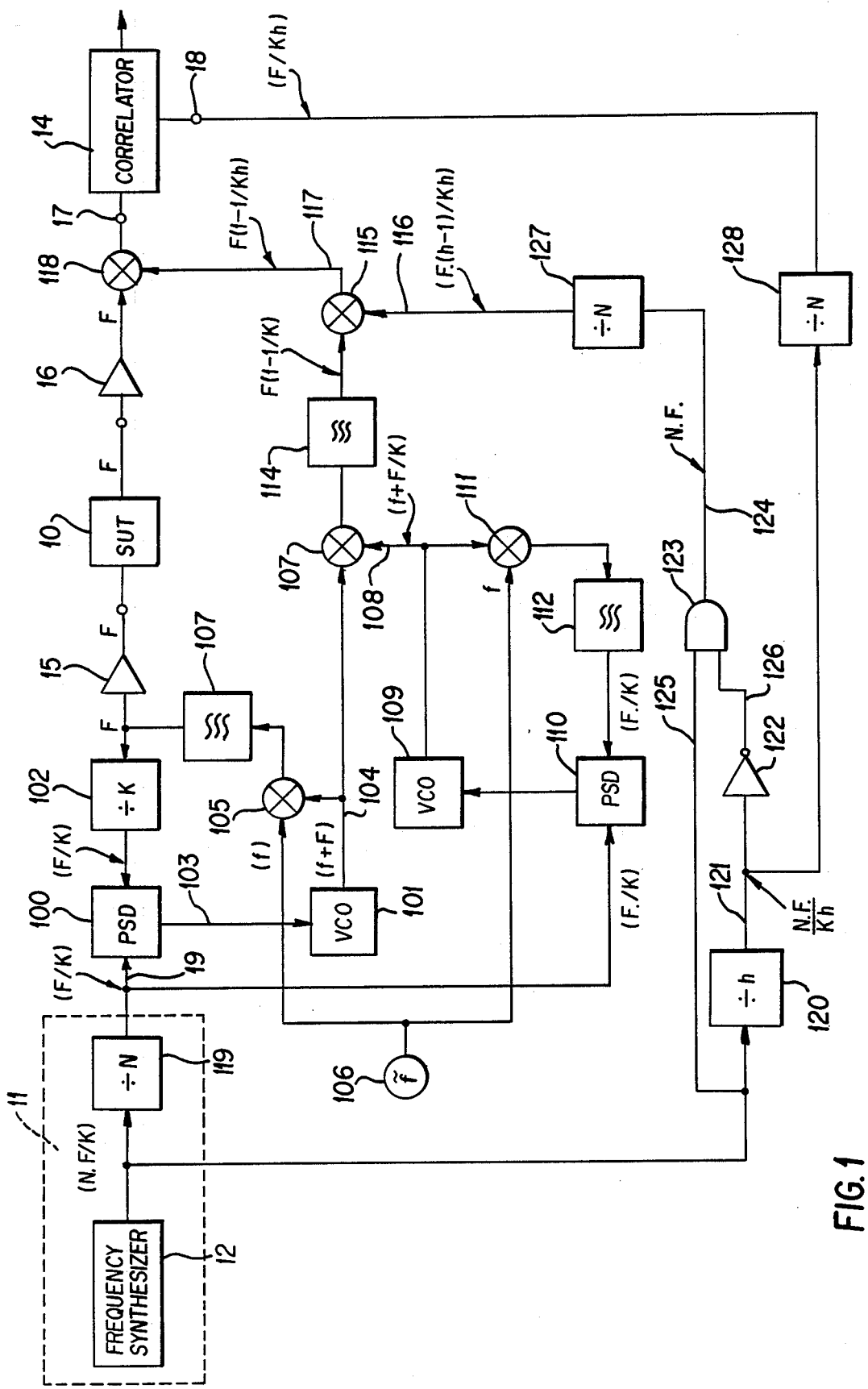

United States Patent [19]

Ryder et al.

[11] Patent Number: 4,868,494
[45] Date of Patent: Sep. 19, 1989

[54] METHODS AND APPARATUS FOR FREQUENCY RESPONSE ANALYSIS

[75] Inventors: Alan Ryder, Church Crookham; Brian Sayers, Farnborough, both of England

[73] Assignee: Schlumberger Electronics UK Limited, England

[21] Appl. No.: 153,404

[22] Filed: Feb. 8, 1988

[30] Foreign Application Priority Data

Feb. 7, 1987 [GB] United Kingdom ............... 8702804

[51] Int. Cl.$^4$ ........................................... G01R 23/14
[52] U.S. Cl. ............................... 324/79 R; 324/77 R; 324/57 R; 324/58 A
[58] Field of Search ............... 324/77 R, 77 G, 77 B, 324/57 R, 58.5, 57 N, 78 R, 78 E, 78 F, 79 R; 364/484, 485, 489

[56] References Cited

U.S. PATENT DOCUMENTS

| | | | |
|---|---|---|---|
| 3,968,427 | 7/1976 | Sharrit | 324/57 SS |
| 3,986,113 | 10/1976 | Vifian | 324/79 R |
| 4,048,559 | 9/1977 | Miedema | 324/57 SS |
| 4,219,770 | 8/1980 | Weinert | 324/58 A |
| 4,274,047 | 6/1981 | Hecken | 324/57 R |
| 4,510,440 | 4/1985 | Ryder | 324/77 R |

Primary Examiner—Michael J. Tokar

[57] ABSTRACT

In a frequency response analyser for operation at high frequencies a signal of frequency F for application to a system under test (15) is generated from a frequency synthesizer (11) capable of operation only at a relatively lower frequency F/K by generating a first signal (19) of frequency at the relatively lower frequency F/K by generating a second signal 104 at the relatively higher frequency (f+F) and generating a third signal (at 114) or F(1—1/K). The second signal is applied to the system under test and an output signal (at 16) derived therefrom. The output is multiplied by the third signal to provide a product signal, and the product signal is analyzed with respect to first signal by means of a correlator 14. The present invention overcomes the limitation in maximum testing frequency imposed by the frequency synthesizers of prior art frequency response analyzers.

7 Claims, 2 Drawing Sheets

METHODS AND APPARATUS FOR FREQUENCY RESPONSE ANALYSIS

This invention relates to methods and apparatus for frequency response analysis, and in particular for testing the response of a system to an input signal at a relatively high frequency.

Frequency response analysis, in which the input signal applied to a system is compared with the output signal from the system at various frequencies, is a well-known technique for characterising the behaviour of, for example, servo systems, rotating machinery, electric and electronic circuits and elastic and viscous materials. The output signal is often analysed by correlating it with reference signals which are in phase and in quadrature phase with the input signal to the system.

In order to permit testing of systems at frequencies above the range of operation of standard correlators, it is also known to mix (or multiply) the output signal from the system under test with an offset signal whose frequency is spaced from the frequency of the input signal applied to the system by an amount equal to the frequency of the desired signal for application to the correlator. The mixing process produces two beat or heterodyne signals, the required one at the difference of the output and offset signal frequencies and an unwanted one (the image signal) at the sum of those frequencies.

At the heart of a frequency response analyser, therefore, is a frequency synthesiser which produces a signal at a starting frequency which produces a frequency component on which the correlator may operate when later divided and mixed; a reference for the correlator being derived by division of this starting frequency.

A straightforward system may be configured using a starting frequency of NF for an input signal to the system under test frequency F, using a divider of N for the input and N+1 (or N−1) for the offset. Thus the offset signal will be at a frequency FN/(N+1). The heterodynes produced by the mixing process are thus the required one at F/(N+1) and the unwanted image one at F(2N+1)/(N+1).

The references signals for the correlator are typically derived from the offset signal via another divide-by-N divider, to produce signals at F/(N+1), the same frequency as the lower of the two heterodyne signals. The correlation process is such that its response is at a maximum at the reference signal frequency and, theoretically, zero at all harmonics of the reference signal frequency. However, the quantised nature of the (digital) correlation process results in reality in a non-zero spurious response at certain harmonic frequencies.

It has been found that it is beneficial to generate an offset with a frequency of F(h−1)h, where h is a heterodyne ratio independent of the input signal division N. A method and apparatus for frequency response analysis based upon this approach is described in United Kingdom patent specification GB No. 2 110 826B.

The prior art offset techniques referred to above is effective to extend the operating range of a frequency response analyser well beyond the frequency of operation of practically realisable correlators, for example up to about 60 khz. There is requirement to extend the operational range of analysers even higher, for example into the MHz range. Such extension cannot be achieved with prior art offset analysers since frequency synthesizer speed limitations are encountered. A clear example is where a digital synthesizer is employed, which itself would typically have a clock frequency of only 10 MHz and be unable to generate a signal of frequency NF, since even F might be in excess of the frequency of the synthesizer clock.

According to the present invention a method for testing the response of a system under test at a relatively higher frequency F using an analyzer capable of generating an analysing a signal at a relatively lower frequency F/K includes the steps of:
generating a first signal of frequency proportional to the relatively lower frequency F/K,
generating a second signal at the relatively higher frequency F,
generating a third signal of frequency proportional to a frequency F(1−1/K).
applying the second signal to the system under test,
deriving an output signal from the system under test,
multiplying the output by the third signal to provide a product signal, and
analysing the product signal with respect to first signal by means of the analyser.

Advantageously, the method may include the steps of generating a fourth signal of frequency proportional to F/K, and multiplying the first and fourth signals together to thereby derive the third signal.

Preferably the second and the third signals are derived from said first signal, which may be synthesized. The second signal is advantageously derived by means of providing a first phase locked loop comprising a voltage controlled oscillator generating said second signal, a feedback divider having a division ratio of 1:1/K, and a phase sensitive detector for comparing the feedback divider signal with the synthesized signal and which generates an error signal to control the voltage controlled oscillator. To further advantage, the third signal may be derived by means of providing a second phase locked loop arranged to generate the fourth signal, and multiplying the first and fourth signals together.

For reference, the voltage controlled oscillators of the first and second phase locked loops are each arranged to generate signals having outputs offset by a frequency f, and the present invention further includes the steps of generating a fifth signal of frequency f and multiplying each voltage controlled oscillator signal thereby.

The present invention may provide a method for testing response using an analyser having a correlator capable of operating at a yet relative lower frequency F/Kh by generating a mixing signal of frequency F(h−1)/Kh and further multiplying the product signal thereby, dividing the first signal by h, and comparing the further multiplied signal and the divided signal in the correlator. Alternatively, the third signal may be multiplied by the mixing signal to give a signal comparable as aforesaid with the divided signal.

According to a second aspect of the present invention apparatus for testing the response of a system under test at a relatively higher frequency F using an analyser capable of generating an analysing a signal at a relatively lower frequency F/K includes:
means for generating a first signal of frequency proportional to the relatively lower frequency F/K,
means for generating a second signal at the relatively higher frequency F,
means for generating a third signal of frequency proportional to a frequency F(1−1/k), means for applying the second signal to the system under test, means for deriving an output signal from the system under test, means for multiplying the output by the third signal to provide a product signal, and means for analysing the product signal with respect to first signal by means of the analyser.

Preferably, the signals may be derived from a signal synthesized at a frequency N.F/K, the invention including additional steps of frequency division by N before application to the system under test to generate the second signal, during generation of the mixing signal, and of the divided signal.

According to a third aspect of the present invention there is provided apparatus for performing the methods recited above.

In order that feature and advantages of the present invention may be further appreciated, two embodiments will now be described, by way of example only, with reference to the accompanying diagrammatic drawings, of which.

Figure 2:
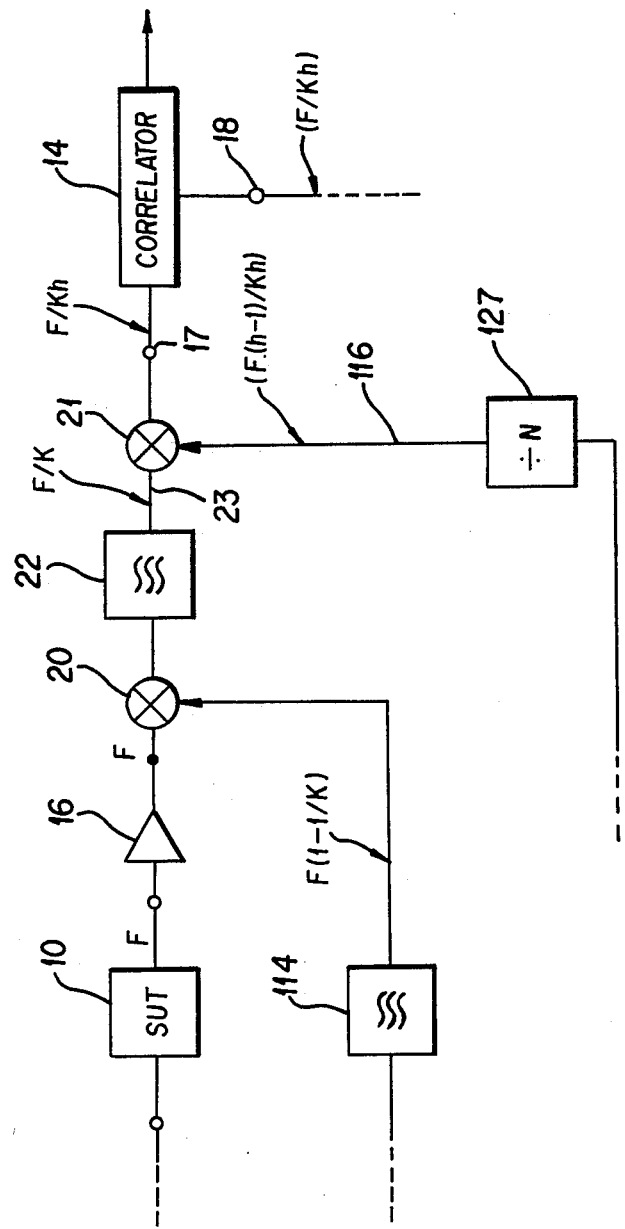

FIG. 1 represents apparatus for response analysis in accordance with the present invention, and FIG. 2 represents part of an alternative embodiment.

Apparatus for testing the response of system Under Test 10 (FIG. 1) at a frequency F includes a signal generator portion 11 having a frequency synthesizer 12, and an analyzer portion comprising a correlator 14. In use the apparatus functions to generate an excitation signal at frequency F which is conditioned by an amplifier 15 for application, by means not shown but which may comprise for example electro-mechanical or hydraulic actuators, to the system under test 10. A return signal derived from the system under test 10, by means again not shown but which may, for example, comprise an electro-mechanical transducer such as an accelerometer, is conditioned by an amplifier 16 for application to a signal input 17 of correlator 14, which performs a correlation with a reference signal applied to a reference input 18. The generation of the excitation signal and the reference signal and the processing of the return signal will now be considered.

Signal generator portion 11 is unable to supply a signal at the relatively higher frequency F required for excitation. A signal of lower frequency, F/K, is generated on line 19. This signal is then stepped up to the required frequency F by means of a phase locked loop comprising, phase sensitive detector (PSD) 100, a voltage control oscillator (VCO) 101 and a divider 102 having a division ratio of 1:1/K. In order that the loop remains stable over the entire range of required excitation, VCO 101 generates a signal having an offset of frequency, F. Thus in response to a control signal supplied from PSD 100 on line 103, the VCO 101 generates a signal of frequency (f+F) on line 104. This signal is multiplied by a mixer 105 with a signal of frequency f, locally generated by an oscillator 106, to yield mixing products at frequencies (F) and (2f+F). A low pass filter 107 is arranged to filter out the upper product yielding a signal of frequency F for application to the system under test 10 via amplifier 15. In accordance with well known phase locked loop design practice, this signal is divided by 1/K by counter 102 to provide a feedback signal of frequency (F/K) for comparison with the synthesized input by PSD 100, and it is this comparison which maintains loop control, via the signal on line 103 referred to above.

The output signal of VCO 101 is multiplied by a mixer 107 with a signal on line 108 derived from a second phase locked loop comprising VCO 109 and PSD 110, which receives the first signal at a frequency of (F/K). VCO 109 is arranged to generate a fourth signal having a frequency offset, (f+F/K), which signal is multiplied with the signal from oscillator 106 at a frequency f by a mixer 111 to provide a signal having products at (F/K) and (2f+F/K). A low pass filter 112 passes the component of frequency (F/K) to PSD 110 for loop control by comparison therein with the signal from generator portion 11. It will be appreciated that mixer 107, receiving signals at frequencies of a second signal (f+F) and a fourth signal (f+F/K) produces multiplication products at F(1−1/K) and 2f+F(1+1/K). A low pass filter 114 passes the lower frequency product to thereby generate a third signal of frequency F(1−1/K).

It will be appreciated by those skilled in the art that given an analyser capable of generating a signal and analysing response at a frequency at the relative lower first signal frequency of F/K then the third signal may be multiplied directly with the return signal from the system under test. Given that the return signal is of nominal frequency F, mixing with the third signal will yield products at F/K and F(2−1/K), which has a product of nominal frequency F/K for correlation with the generated signal as reference. It will further be appreciated that the present invention may also be utilized with the known offset technique by providing for synthesis of a frequency N.F/K and by providing dividers of ratio 1:N both before application to the system under test and to provide a reference of frequency F/K.

However, in order to avoid the problems inherent in the offset technique as discussed earlier, in the present embodiment the third signal is multiplied by mixer 115 by a mixing signal of frequency F(h−1)/Kh provided on line 116. This multiplication yields theoretical mixing products of F(1−2/K+1/Kh) and F(1−1/Kh), which process, ignoring the negative frequency term, provides a mixing signal of frequency F(1−1/Kh) on line 117. The mixing signal is subsequently multiplied with the return signal from the system under test 10 of nominal frequency F by mixer 118, which yields mixing products of frequency F/Kh and F(2−1/Kh), which are input to correlator 14 via reference input 17. Correlation is performed with respect to a reference signal of frequency F/Kh applied via reference input 18 of correlator 14. Generation of the mixing signal (line 117) and the reference signal (input 18 of correlator 14) will now be described.

Frequency synthesizer 12 is arranged to generate a signal of frequency N.F/K, which is fed to a divider 119 having a division ration of 1:N to provide the required generator portion frequency F/K on line 19. In order to generate the mixing signal, the output of the frequency synthesizer 12 is firstly fed into a divider 120 having a division ratio of 1:h to provide signal of frequency N.F/Kh on line 121. This signal is then inverted by an inverter 122 and used to gate the output of the frequency synthesizer 12 via AND gate 123. The effect of this is to generate a signal of effective frequency N.F/K(h−1)/h at the AND gate output on line 124, as follows.

The purpose of divider 120, inverter gate 122 and AND gate 123 is to produce a counter enable waveform which allows input 123 to AND gate 127 to count at (h−1)/h of the rate of counter 119. Input 125 to AND gate 123 is an enable waveform which is used to enable counters 119, 127 and 128 to count.

The divide by h counter therefore produces an enable waveform which is high for one pulse out of every h counter enables. The inverter produces a waveform which is high for h−1 out of every h counter enables therefore. When signals 125 and 126 are AND-ed together the resulting enable waveform when applied to counter 127 produces an output signal (116) at a frequency of NF (h−1)/Kh.

The reference signal for input 18 is derived by divider 128 having a division ratio of 1:N which divides the output of counter 120 to give a reference at the required frequency of F/Kh.

In an alternative embodiment of the present invention the third signal may be used to multiply the return signal from the system under test 10 and the resulting signal multiplied by the mixing signal on line 116. Such an arrangement is shown in FIG. 2, which represents a part of frequency response analysing apparatus. Where parts of the apparatus are the same as the apparatus of FIG. 1, common reference numerals have been used, and those parts of the apparatus which are not shown may be the same as those of the apparatus of FIG. 1.

A mixer 20 receives the return signal from the system under test 10 at nominal frequency F via conditioning amplifier 16, which it multiplies by the third signal of frequency $F(1-1/K)$ to give mixing products of frequency $F/K$ and $F(2-1/K)$. A low pass filter 22 passes the lower product so that a signal of frequency $F/K$ appears on line 23. This signal is multiplied by the mixing signal of frequency $F(h-1)/Kh$ by mixer 21 to yield products of frequency $F/Kh$ and $F(2.1/K-1/Kh)$, which are applied to signal input 17 of correlator 14 for correlation with the reference signal of frequency $F/Kh$ applied to reference input 18.

From the foregoing descriptions the following features of the embodiments will be apparent. The upper frequency which can be tested, F, is in excess of that which has to be generated by the frequency generator portion (F/K) or the synthesizer (N.F/K). The embodiments also operate with a correlator which only has to function at a lower frequency still (F/Kh). By careful choice of the division ratios N and h spurious non-zero responses in the correlation process are avoided.

For analyzer apparatus in accordance with the present invention testing at up to 65 MHz may be achieved with a value of 1000 assigned to K. The frequency generator portion, therefore must be capable of generating a frequency up to 65 KHz, which may be derived from a synthesizer running at 10.5 MHz. With such a configuration, division ratio h might typically be 61. For testing over the entire band, range changing by controlling the value of K may be employed, for example providing a test range of 6.5 MHz to 65 MHz with K=1000, 650 KHz to 6.5 MHz (K=100), and 65 KHz to 650 KHz (K=10).

We claim:

1. A method for testing the response of a system under test at a test frequency F using a frequency response analyzer having a correlator having a signal input and a reference input and a frequency synthesizer capable of generating an analyzing signal at a frequency proportional in frequency to F/K, where F/K is lower in frequency than F, including the steps of:
generating a first signal proportional in frequency to said lower frequency F/K by means of said synthesizer,
deriving from said first signal a second signal at said test frequency F,
deriving from said first signal a third signal at a frequency proportional to $F(1-1/K)$,
applying said second signal as an excitation signal to said system under test,
deriving an output signal from said systems under test in response to said excitation signal,
multiplying said output signal by said third signal to derive a product signal, and
applying said product signal to said correlator signal input and applying said first signal of frequency proportional to F/K to said correlator reference input, to thereby test said response.

2. A method for testing the response of a system under test as claimed in claim 1 and including the steps of generating a fourth signal of frequency proportional to F/K, and multiplying the second and fourth signals together to thereby derive the third signal.

3. A method for testing the response of a system under test as claimed in claim 1 and wherein the second signal is derived by means of providing a first phase locked loop comprising a voltage controlled oscillator generating said second signal, a feedback divider having a division ratio of 1:1/K, and a phase sensitive detector for comparing the feedback divider signal with the synthesized signal and which generates an error signal to control the voltage controlled oscillator.

4. A method for testing the response of a system under test as claimed in claim 1 and wherein second and fourth signals are offset by a frequency f.

5. A method for testing the response of a system under test as claimed in claim 1 and wherein said signal of frequency proportional to F/K applied to said correlator reference input is said first signal.

6. Apparatus for testing the response of a system under test at a test frequency F including a frequency response analyzer having a correlator having a signal input and a reference input and a frequency synthesizer capable of generating an analyzing signal at a frequency proportional to F/K, where F/K is lower in frequency than F, said synthesizer generating a first signal proportional in frequency to said lower frequency F/K, further including:
means for deriving from said first signal a second signal at said test frequency F,
means for deriving from said first signal a third signal at a frequency proportional to $F(1-1/K)$,
means for applying said second signal as an excitation signal to said system under test,
means for deriving an output signal from said system under test in response to said excitation,
means for multiplying said output signal by said third signal to derive a product signal, and
said correlator receiving said product signal at said signal input and a signal derived from said synthesizer of frequency proportional to F/K at said reference input, to thereby test said response.

7. A method of testing the response of a system under test of a test frequency F, comprising the steps of:
generating a first signal proportional to a frequency F/K that is lower than said test frequency F;
deriving from said first signal a second signal at said test frequency F;
deriving from said first signal a third signal at a frequency proportional to $F(1-1/K)$,
applying said second signal as an excitation signal to said system under test, deriving an output signal from said system under test in response to said excitation signal; and
multiplying said output signal by said third signal to obtain a product signal, and
correlating said product signal and said first signal to obtain an output signal indicative of said response of said system under test.

* * * * *